(12) United States Patent
Tsai (10) Patent No.: US 7,870,527 B2
(45) Date of Patent: Jan. 11, 2011

(54) METHOD FOR STACKED PATTERN DESIGN OF PRINTED CIRCUIT BOARD AND SYSTEM THEREOF

(75) Inventor: Ming-Chin Tsai, Hsin-Chu (TW)

(73) Assignee: King Yuan Electronics Co., Ltd, Hsin-Chu (TW)

( * ) Notice: Subject to any disclaimer, the term of this patent is extended or adjusted under 35 U.S.C. 154(b) by 433 days.

(21) Appl. No.: 11/970,744

(22) Filed: Jan. 8, 2008

(65) Prior Publication Data
US 2009/0031273 A1  Jan. 29, 2009

(30) Foreign Application Priority Data
Jul. 27, 2007  (TW) ............................... 96127617 A (51) Int. Cl.
*G06F 17/50* (2006.01)
(52) U.S. Cl. ............................... 716/11; 716/1; 716/15
(58) Field of Classification Search ............... 716/1, 716/11, 15
See application file for complete search history.

(56) References Cited

U.S. PATENT DOCUMENTS

| 7,409,667 B1 * | 8/2008 | Pritchard et al. ............... 716/15 |
| 7,418,687 B2 * | 8/2008 | Okano et al. ................... 716/11 |
| 2001/0047508 A1 * | 11/2001 | Miura et al. ..................... 716/8 |
| 2005/0098346 A1 * | 5/2005 | Fan et al. ...................... 174/260 |
| 2005/0240888 A1 * | 10/2005 | Bacchus et al. ................ 716/6 |
| 2006/0162960 A1 * | 7/2006 | Montgomery et al. ....... 174/262 |

\* cited by examiner

*Primary Examiner*—Jack Chiang
*Assistant Examiner*—Patrick Sandoval
(74) *Attorney, Agent, or Firm*—Stout, Uxa, Buyan & Mullins, LLP (57) ABSTRACT

A method for designing stacked pattern of PCB utilizing genetic algorithm and the system thereof are disclosed. The method comprises the following steps: First of all, information data of stacked pattern is inputted into operational interface of the software; Next, initial solution sets of stacked pattern are generated; Then, duplications of the initial solution sets of stacked pattern are generated according to a fitness function; Afterward, crossover of the duplications of stacked pattern are performed at random; Then, mutations are executed by a probability at random; Finally, identification is performed to check if the solution approaches the standard of demand and the result of stacked pattern is shown; otherwise, operational step jumps to duplicate step and repeats above steps until satisfying solution is obtained. The most suitable way for package can be arranged out through making especially mathematical calculations by the system efficiently.

31 Claims, 6 Drawing Sheets

|   | STACK 1 | STACK 2 | ... | STACK m |
|---|---|---|---|---|
| S | $P_1$ | $P_4$ | | |
| G | $F_3$ | $F_1$ | | |
| P | $P_3$ | $P_7$ | | |
| P | $F_2$ | $F_2$ | | |
| G | $P_1$ | $P_3$ | | |
| S | | | | |

FIG. 5

|   | STACK 1 | STACK 2 | ... | STACK m | TOTAL REPRODUCTED NUMBER |
|---|---|---|---|---|---|
| REPRODUCTED NUMBER | 2 | 0 | | | m |

FIG. 6

| STACK 1 | STACK 2 | CROSSOVER POINT | OFFSPRING STACK |
|---|---|---|---|
| $P_1F_3P_3F_2P_1$ | $P_4F_1P_7F_2P_3$ | 2 | $P_1F_3P_7F_2P_3$ |

FIG. 7

| SIGNAL | 7 | POWER | 2 |
|---|---|---|---|
| THICKNESS OF STACK | 143 | LINE-WIDTH | 8 |
| PCB | L/B | TOP LAYER | S |
| THICKNESS OF COPPER FOIL | 1oz | | |
| 1 | S | 4.8 ||
| 2 | G | 8.5 ||
| 3 | S | 7 ||
| 4 | S | 8.5 ||
| 5 | G | 7 ||
| 6 | S | 30.3 ||
| 7 | G | 12.2 ||
| 8 | P | 30.3 ||
| 9 | P | 5.5 ||
| 10 | G | 8.5 ||
| 11 | S | 7 ||
| 12 | S | 8.5 ||
| 13 | G | 4.8 ||
| 14 | S | | |
| TOTAL THICKNESS | | 142.9 ||
| ERROR | | -0.07% ||

METHOD FOR STACKED PATTERN DESIGN OF PRINTED CIRCUIT BOARD AND SYSTEM THEREOF

BACKGROUND OF THE INVENTION (1) Field of the Invention

The present invention relates to a method for stacked pattern design of printed circuit board. More particularly, the present invention relates to a method utilizing genetic algorithm for stacked pattern design of printed circuit board.

(2) Prior Art

Printed circuit board (PCB) is a circuit board made by using machining and surface treatment to make a layout of routing traces of a circuit design on an insulator. The circuit could be formed by connecting specific electric devices to the PCB. Then, the functions of specific electric devices could be used to process electric signals. The quality of PCB design would affect directly the reliability of electric product, and performance and competitiveness of systemic product. Besides, an accurate layout of PCB is manufactured by several techniques such as printing, photography, etching, and electroplating. Thus, the techniques which manufacture the high density and multilayer PCB are the mainstream of manufacturing industry of PCB.

However, when the electronic equipments are more complicated and the number of required devices is increased, the density and integration of the routing traces on the PCB would be also increased. Therefore, an important issue is how to efficiently integrate several parameters of PCB design such as types of stacked pattern, thickness of each layer, control of impedance, symmetry and line-width in order to meet the requirements of PCB design.

In tradition, the way of stacked pattern and thickness of each layer of PCB are calculated manually by engineers who design PCB. However, the traditional stacked pattern method not only spends time but also lacks efficiency. Moreover, when numbers of layer of PCB increase, it's more difficult to find a suitable way to design stacked pattern of PCB.

Therefore, it is necessary to find a method for designing stacked pattern of PCB which could save manpower and shorten time of designing.

SUMMARY OF THE INVENTION

An object of the present invention is to provide a method for designing stacked pattern of PCB and system thereof. The method and system thereof could save manpower and shorten time of designing.

To achieve the object mentioned above, the present invention provides a system for designing stacked pattern of PCB, which comprises: an input unit used to receive information data of stacked pattern; a processing unit connecting to the input unit wherein a stacked pattern of PCB is calculated by the processing unit using genetic algorithm; a storage unit connecting to the processing unit wherein a plurality of current parameters of PCB are stored in the storage unit; and an output unit connecting to the processing unit wherein the result of the stacked pattern of PCB is displayed by the output unit.

Besides, the present invention further provides a method utilizing genetic algorithm for designing stacked pattern of PCB, and the method has the following steps. First of all, information data of stacked pattern are inputted into operational interface of software; Next, initial solution sets of stacked pattern are generated; Then, duplications of the initial solution sets of stacked pattern are generated according to a fitness function; Afterward, crossover of the duplications of stacked pattern are performed at random; Then, mutations are executed by a probability at random; Finally, identification is performed to check if the solution approaches the standard of demand and the result of stacked pattern is shown; Otherwise, operational step jumps to duplicate step and repeats above steps until satisfying solution is obtained. This method of designing stacked pattern of PCB comprises automatic stack mode and assigned stack mode. Users could quickly get the most suitable method of designing stacked pattern PCB for reference in time after they provide several information data of PCB to this system, such as the type of PCB types of top layer, thickness of copper foil, numbers of signal layer, numbers of power layer, and total thickness and line-width of PCB.

In the following description of the preferred embodiment, reference is made to the accompanying drawings which form a part hereof, and in which is shown by way of illustration a specific embodiment in which the invention may be practiced.

DETAILED DESCRIPTION OF THE INVENTION

Figure 1:
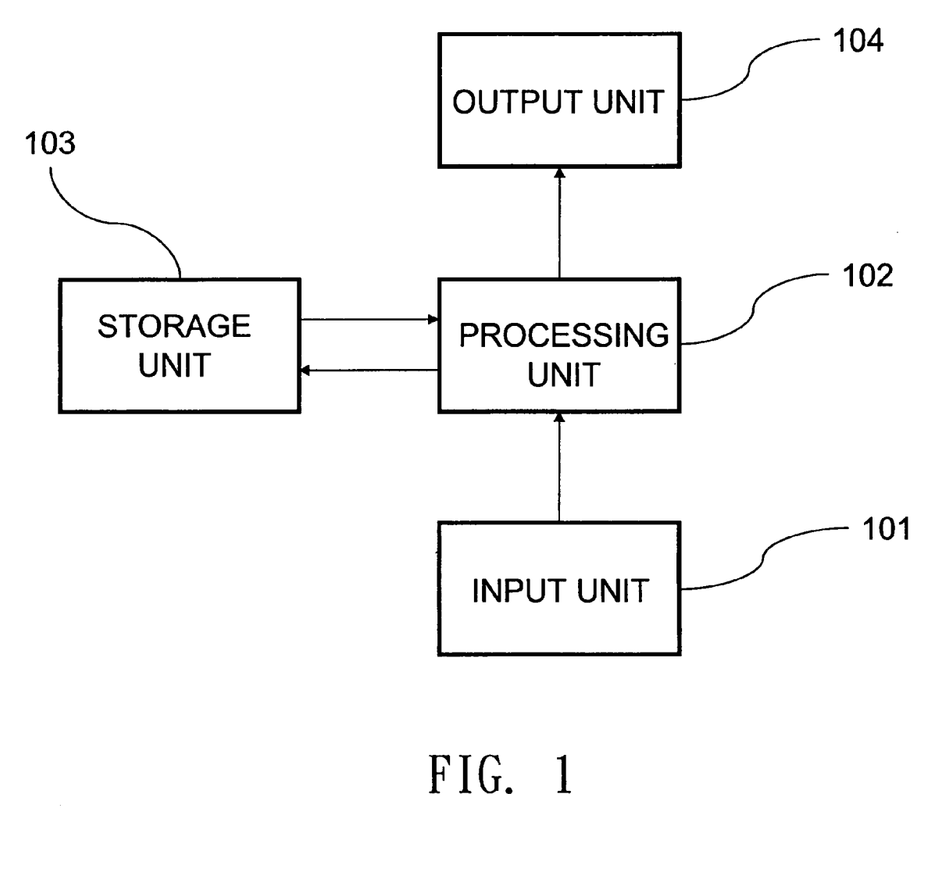
FIG. 1 is a schematic diagram of system of the present invention.

FIG. 1 shows one embodiment of the system of the present invention. The system comprises an input unit 101, a processing unit 102, a storage unit 103, and an output unit 104. A user could enter several information data to the processing unit 102 for calculating by the input unit 101. The information data are some parameters of PCB, such as type of PCB, types of top layer, thickness of copper foil, numbers of signal layer, numbers of power layer, and total thickness and line-width of PCB etc. The input unit 101 comprises an input user interface of software comprising programs written by JAVA programmable language. The processing unit 102 includes at least one processor and one memory to load and execute program code. All current parameters of PCB are stored in the storage unit 103 which connects the processing unit 102. Therefore, the current parameters related to the input parameters in the storage unit 103 are selected to processing unit 102 for calculation after the input parameters information data of the PCB are inputted. After data are calculated by the processing unit 102, the result of stacked pattern of PCB would be outputted by the output unit 104 and be displayed. Moreover, the result could be outputted and displayed on the same user interface of input interface of software by the output unit 104.

Figure 2:
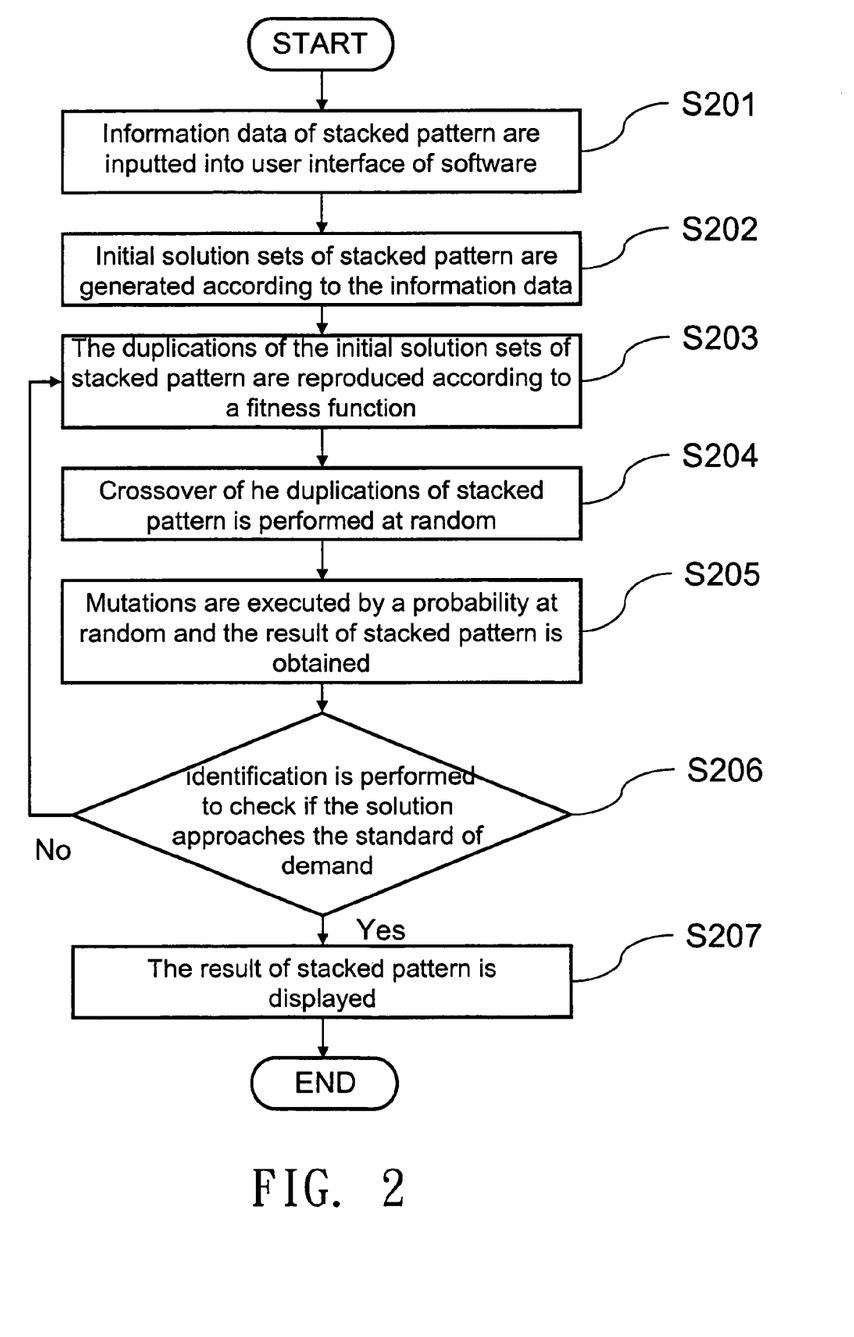
FIG. 2 is a flowchart of one embodiment of method of the present invention.

FIG. 2 shows a flowchart of one embodiment of the method of designing stacked pattern of PCB of the present invention. An embodiment accompanying FIG. 3~7 is used to describe the method in FIG. 2. The method comprises the following steps. First of all, in step S201, information data of stacked pattern are inputted into user interface of software. Nest, in step S202, initial solution sets of stacked pattern are generated. Then, in step S203, duplications of the initial solution sets of stacked pattern are generated according to a fitness function. Afterward, in step S204, crossover of the duplications of stacked pattern is performed at random. Then, in step S205, mutations are executed by a probability at random. Finally, in step S206, identification is performed to check if the solution approaches the standard of demand, and in step S207, the result of stacked pattern is shown. Otherwise, operational step jumps to duplicate step and repeats above steps until satisfying solution is obtained. Moreover, the processes mentioned above could be executed in a computer-readable medium.

Figure 3:
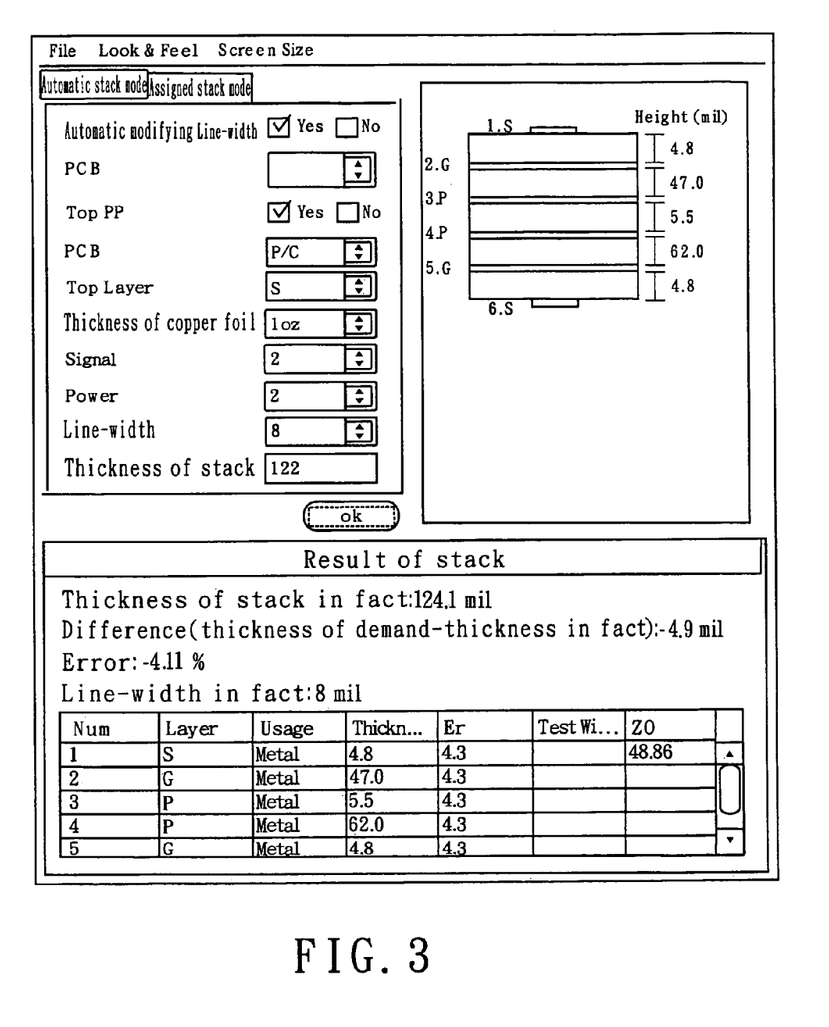
FIG. 3 is an user interface diagram of automatic stack mode of one embodiment of the present invention.
Figure 4:
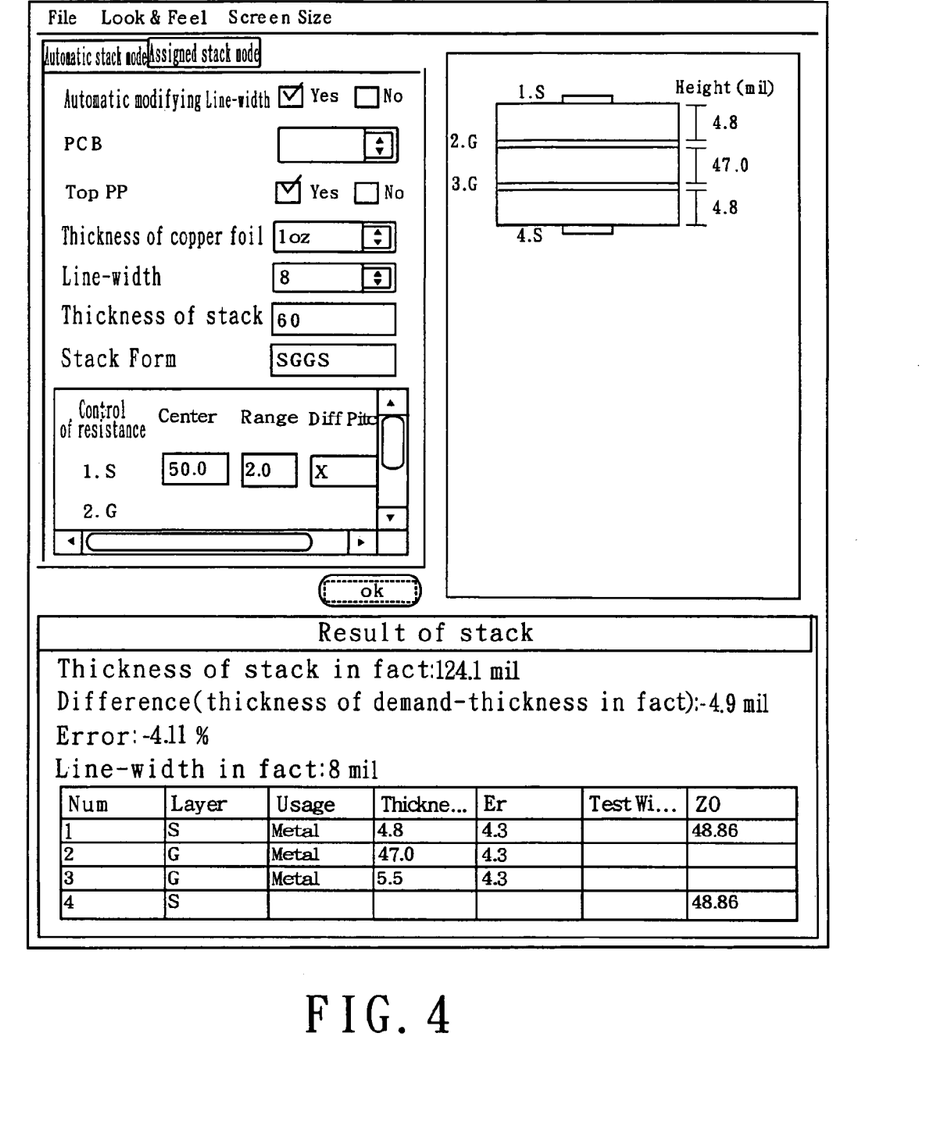
FIG. 4 is an user interface diagram of assigned stack mode of one embodiment of the present invention.

In step S201, information data of stacked pattern are inputted into user interface of software. In this embodiment, the user interfaces of software are shown in FIG. 3 and FIG. 4. FIG. 3 shows the input user interface of automatic stack mode, wherein the automatic stack mode means that the type of stacked pattern is not needed to be assigned. FIG. 4 shows the input interface of assigned stack mode. The information data of stacked pattern of PCB include some parameters, such as automatic modifying setting of line-width, PCB manufacturer, material of top layer, type of PCB, type of top layer, thickness of copper foil, numbers of signal layer, numbers of power layer, line-width, and total thickness of stacked pattern etc. These information data are provided to the processing system for calculation by using the user interface of software as shown in FIG. 3. The result of stacked pattern is obtained and displayed after calculation. Moreover, the result of stacked pattern is displayed by a form, such as SGPPGS, wherein the symbol S means signal layer, the symbol G means ground layer, and the symbol P means power layer.

Moreover, the user interface of software could be a graphic user interface, which comprises a display device and a selection device. The display device is used to display the information data of stacked pattern of demanded PCB entered by user and the result of stacked pattern of PCB. The selection device could provide a drop-down menu for user to select.

Here, FIG. 3 shows the user interface of the automatic stack mode of this embodiment of the present invention. The automatic modifying setting of line-width could be selected by selecting symbols Yes or No, and the PCB manufacturers also could be selected. The purpose of selection of PCB manufacturers is to choose the current specifications of PCBs of the selected PCB manufacturer from database by this system. Material of top layer also could be selected by selecting symbols of Yes or No in this embodiment, wherein the selected material is polypropylene (PP) if the symbol Yes is selected. Otherwise, if the symbol No is selected, the material of top layer would be epoxy-glass composite (FR4) automatically. Moreover, the type of PCB could be selected by selecting probe card (P/C), load board (L/C), or DUT board (D/B). The type of top layer could be selected by selecting signal layer S, power layer P, or ground layer G. Moreover, user need to enter some parameters, such as thickness of copper foil, numbers of signal layer, numbers of power layer, line-width, and total thickness of stacked pattern. For example, in FIG. 3, the value of the thickness of copper foil is 1 oz, the number of signal layer is 2, the number of power layer is 2, the value of line-width is 8 mils (1 mil=0.0254 mm), and the value of total thickness of stacked pattern is 122 mils. After all parameters are entered, the input process is done.

Figure 5:
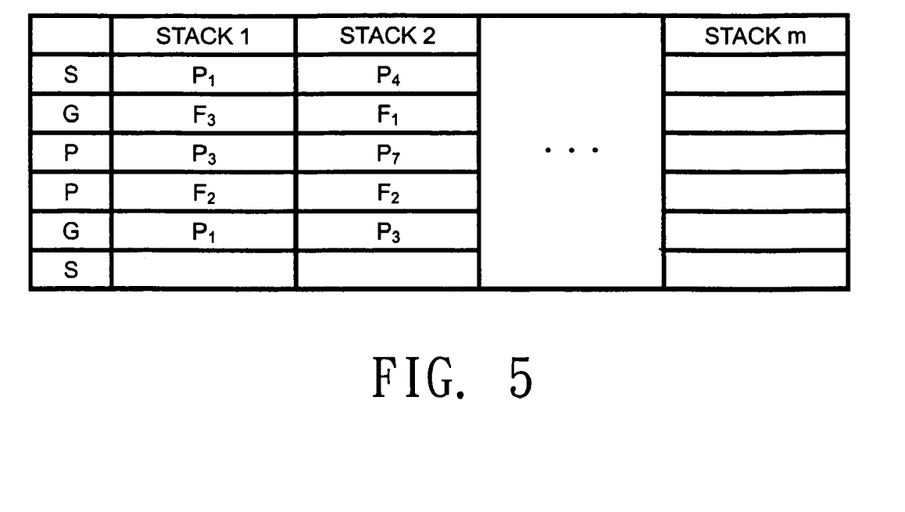
FIG. 5 is a schematic diagram of generation of the initial stacked pattern of one embodiment of the present invention.

In step S202, initial solution sets of stacked pattern are generated according to the information data. If the thicknesses of PP types of PCB provided by a PCB manufacturer has n types, such as {P1, P2, ..., Pn}, and the thicknesses of FR4 also has n types, such as {F1, F2, ..., Fn}. The result of stacked pattern would be SGPPGS, which is constructed with several different polypropylene P layers and several different epoxy-glass composite F layers. As the numbers of demand stacked pattern is m, the initial solution sets of stacked pattern generated would be m sets, as shown in FIG. 5. The stacked pattern of STACK 1 is P1F3P3F2P1, and the stacked pattern of STACK 2 is P4F1P7F2P3 and there are m sets of stacked pattern generated by the system selecting several different PP layers and FR4 layers from PCB manufacturer to construct the stacked pattern of PCB. In this step, the generated initial solution sets of stacked pattern are only conformed for the limitation of forms of stacked pattern and PCB manufacturer. Other parameters still are not considered, such as type of PCB, thickness of copper foil, line-width, and total thickness of stacked pattern.

Figure 6:
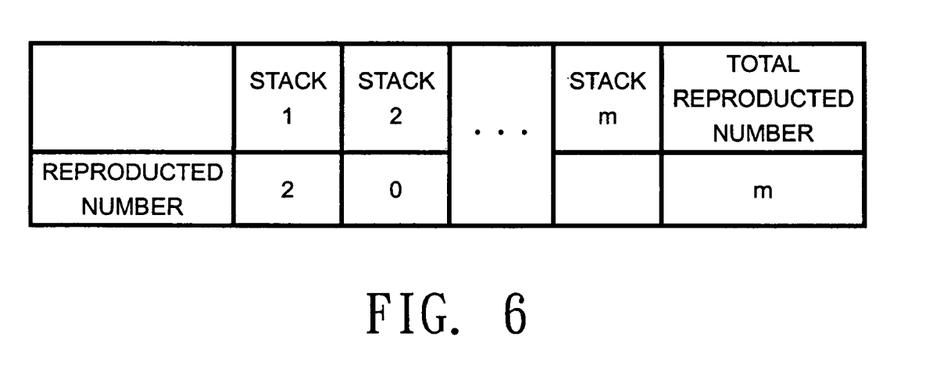
FIG. 6 is a schematic diagram of duplication process of one embodiment of the present invention.

In step S203, the duplications of the initial solution sets of stacked pattern are reproduced according to a fitness function. In this step, a calculating process is used to determine the numbers of offsprings, which need to be eliminated or which need to be reproduced all according to the fitness of species in genetic algorithm. In this embodiment, the fitness function may be $f(x)=1/[(\text{thickness of demand minus total thickness of stacked pattern})+1]$. If the thickness of demand equals to the thickness of stacked pattern, the highest value of the fitness function would be 1. The fitness functions of m sets of stacked pattern can be calculated to obtain the fitness functions f1, f2, ..., fm, and the expected value of the offspring is $fi/(f1+f2+\ldots+fm)$. Therefore, the number of reproduced STACK could be determined by that the expected value of the offspring multiplying by m, as shown in FIG. 6. For example, the fitness function of reproduced STACK1 is calculated by $f(1)=1/[\text{thickness of demand minus thickness of STACK1}]$ and expressed by symbol f1. The value of the thickness of STACK1 is got by summing P1, F3, P3, F2, and P1. Then, the numbers of reproduced STACK1 is calculated by the expected value of the STACK1, $f1/(f1+f2+\ldots+fm)$, multiplying by m. In FIG. 6, the number of the reproduced STACK1 is a solution sets. The total numbers of reproduction of STACK still are m, which are calculated by summing all numbers of each STACK, and the expression is shown as $[f1/(f1+f2+\ldots+fm)]m+[f2/(f1+f2+\ldots+fm)]m+\ldots+[fm/(f1+f2+\ldots+fm)]m=m$. Then, the reproduction process is finished. However, the numbers of STACK still are the same after the reproduction process, but the rate of matched STACK is raise. Therefore, even if the first offspring doesn't reach the standard of demand, the second offspring could more approach to the standard of demand.

Figure 7:
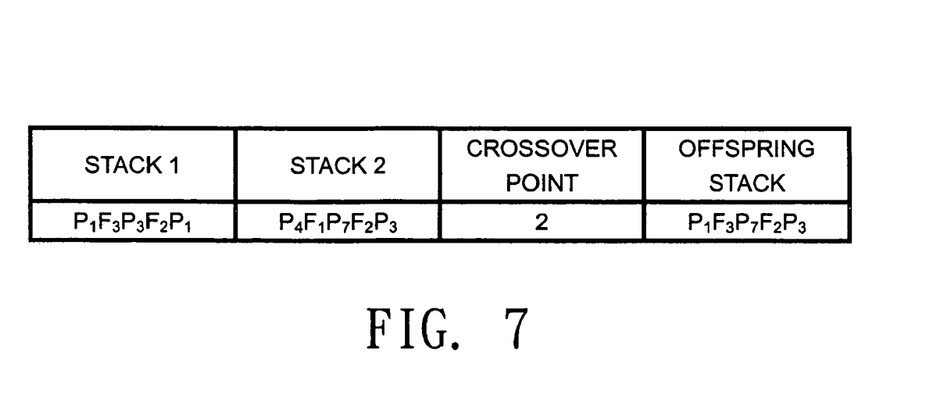
FIG. 7 is a schematic diagram of crossover process of one embodiment of the present invention.

In step S204, crossover of the duplications of stacked pattern is performed at random. This step is crossover process. The crossover point is found from the duplications of the initial solution sets of stacked pattern at random, and crossover of the duplications of stacked pattern is performed for generating offspring. For example, the selected parent stacked patterns are STACK1 and STACK2, as shown in FIG. 7. The stacked pattern of STACK1 is P1F3P3F2P1 and STACK2 is P1F3P7F2P3. If the crossover point is 2 selected at random, the stacked pattern of offspring would be P1F3P7F2P3. It is kept P1F3 of STACK1 and P7F2P3 of STACK2 in the stacked pattern of offspring. Even crossover process is performed m times, as long as only one offspring is generated by crossover process each time, the number of stacked pattern of offspring still is m. The offspring of stacked pattern has different characteristics from the parent stacked pattern after crossover process. Therefore, the stacked pattern after crossover process could more match the stacked pattern of demand.

In step S205, mutations are executed by a probability at random and the result of stacked pattern is obtained. This step is mutation process. The purpose of mutation process is to avoid that some useful parameters of PCB would be lost during the reproduction process or crossover process. The lost useful parameters of PCB could be restored by the mutation process. One layer of the stacked pattern could be changed at random by mutation process. For example, the stacked pattern P2F3P7F2P3 is more conformed for the demand stacked pattern than the stacked pattern P1F3P7F2P3, but the parameter P2 is lost during the reproduction process or crossover process. If the mutation process is happened, the first layer of stacked pattern P1F3P7F2P3 is changed into P2. The stacked pattern P1F3P7F2P3 is mutated to being stacked pattern P2F3P7F2P2, which is more similar to the demand stacked pattern. However, the mutation process is happened at random, in the other word, the mutation process would happen uncertainly.

In step S206, identification is performed to check if the solution approaches the standard of demand. If the result of stacked pattern is reached the standard of demand, the step S207 would be happened that the result of stacked pattern is displayed. Otherwise, the result of stacked pattern is not reached the standard of demand, the steps S203~S206 would be repeated by system for generating offspring. In this embodiment, the standard of demand is determined by the information data of demand stacked pattern of PCB, such as automatic modifying setting of line-width, material of top layer, type of PCB, type of top layer, thickness of copper foil, numbers of signal layer S, numbers of power layer P, line-width, and total thickness of stacked pattern etc. In FIG. 3, the information data is entered as line-width could be modified automatic, material of top layer is selected as PP, type of PCB is selected as probe card, type of top layer is selected as signal layer S, the value of the thickness of copper foil is entered as 1 oz, the number of signal layer is entered as 2, the number of power layer is entered as 2, the value of line-width is entered as 8 mils, and the value of total thickness of stacked pattern is entered as 122 mils. Then, the calculated result of stacked pattern would be displayed on the below area of the same user interface of software. In FIG. 3, the total thickness of stacked pattern after calculating is 124.1 mils, which has 4.1% error to 122 mils, the total thickness of demand. However, if the error of the result is smaller than 5% which is the required ranges of standard of demand, the standard of demand is reached and the result would be displayed. Therefore, the percentage of error of the result is 4.1% which still reach the standard of demand, and the result of stacked pattern is displayed on the same interface of software for reference.

The result of stacked pattern is that the total thickness of stacked pattern is 124.1 mils, difference (thickness of demand minus thickness of stacked pattern) is 4.9 mils, the error is −4.11%, the line-width of stacked pattern is 8 mils, material of top layer is PP, thickness of top layer is 4.8 mils, material of second layer is FR4, thickness of second layer is 47.9 mils, material of third layer is PP, thickness of third layer is 5.5 mils, material of forth layer is FR4, thickness of forth layer is 62.0 mils, material of fifth layer is PP, and thickness of fifth layer is 4.8 mils etc. Moreover, the illustration of result of stacked pattern would be displayed on the up right area of the interface of software for reference. In the area, the correct value of thickness is shown. But, the size of illustration is not the real size of the thickness of stacked pattern.

The process of the method of the present invention could be described more clearly after combining all steps mentioned above. First of all, user could enter the information data such as type of PCB, material of top layer, thickness of copper coil, numbers of signal layer, numbers of power layer, line-width, and total thickness of stacked pattern to the system. Because the system is stored all parameters of PCB that PCB manufacturers provided, a plurality of arrangement combination are generated by the system selecting the parameters of the database which depend on the information data from the user. These are initial solution sets of stacked pattern in step S202. Then, numbers of duplications of the initial solution sets of stacked pattern are determined by this system depending on the fitness of solution sets of stacked pattern, and the required parameter is thickness of stacked pattern in this embodiment. After the reproduction process S203 finished, crossover of the duplications of stacked pattern is performed at random, wherein the crossover points are also selected at random by system. This is crossover process S204. Next, the mutation process S205 happens at random. This means whether the mutation process happens or not is determined at random by system. The mutation process is that one layer of stacked pattern is changed at random by system. The advantage of the mutation process is that the stacked pattern of PCB after mutation process would be generated which more approaches to the stacked pattern of demand than the original stacked pattern. Even the results of stacked pattern are not reached the standard of demand at first time, but the results of stacked pattern could be the initial populations of the second time. Therefore, the results of stacked pattern generated at second time would more approach to the fitness function than the stacked pattern at first time. This is the advantage of the system using genetic algorithm of the present invention. The step S206 is that identification is performed to check if the solution approaches the standard of demand. If the result is reached the standard of demand, the final step S207 that the result of stacked pattern is displayed would be performed for reference, as shown in FIG. 7. Otherwise, the results of stacked pattern don't reach the standard of demand, the results of stacked pattern would be the initial solution sets of stacked pattern in reproduction process S203. Then, the processes would be repeated by system for generating the offspring, until the results of stacked pattern reach the standard of demand.

FIG. 4 shows assigned stack mode of the embodiment of the present invention. This mode is that a specify form of stacked pattern such as SGGS is assigned by user. If a user uses the automatic stack mode to calculate, the result of stacked pattern is probably not SGGS even all the information data are matched. In this condition, the user could choose the assigned stack mode and assign the form of stacked pattern to be SGGS, therefore, the result of stacked pattern must be the form of SGGS and match the information data.

Figure 8:
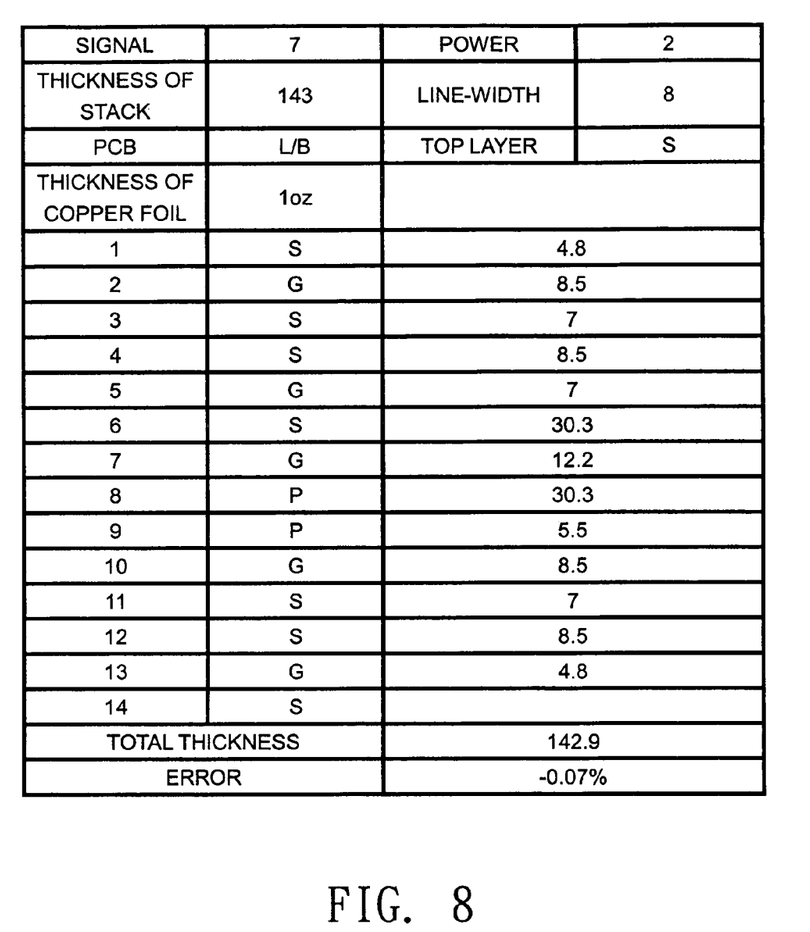
FIG. 8 is a schematic diagram of calculation result of one embodiment of the present invention.

FIG. 8 shows the calculated result using the stacked pattern design system of the present invention. In FIG. 8, the result of stacked pattern is got by entering the information data for calculating, which the information data comprise that the demand number of signal layer is 7, the demand number of power layer is 2, the thickness of stacked pattern is 143 mils, the value of line-width is 8 mils, the type of PCB is load board, the type of top layer is signal layer and thickness of copper foil is 1 oz. It's easy to see the result of stacked pattern in FIG. 8 which has seven signal layer and two power layer that match the information data. The total thickness of stacked pattern is 142.9 mils and error is 0.07%. Because the error is smaller than 5%, the result of stacked pattern reaches the standard of demand and outputted to display for reference.

Thus, the most suitable stacked pattern of PCB could be found quickly by using the system of the present invention. Only the user enters information data of stacked pattern of PCB, the best stacked pattern mode which match the information data would be displayed after a very short time. Using the system to replace manual operation not only saves time and manpower, but also reduces time of designing PCB. Moreover, when the structure of stacked pattern is complicated, using this system to find the suitable stacked pattern of PCB is more efficiency.

The specific arrangements and methods herein are merely illustrative of the principles of this invention. Numerous modifications in form and detail may be made by those skilled in the art without departing from the true spirit and scope of the invention.

What is claimed is:

1. A system for stacked pattern design of a printed circuit board (PCB), including:
   an input unit used to receive information data of a stacked pattern design;
   a processing unit connected to the input unit wherein the stacked pattern design of the PCB is calculated by the processing unit, wherein the processing unit performs steps of:
   (a) analyzing the received information data of the stacked pattern design input into the user interface;
   (b) generating initial solution sets of the stacked pattern design according to the information data;
   (c) generating duplications of the initial solutions sets of the stacked pattern design according to a fitness function of the initial solution sets, wherein said fitness function is calculated based on a formulated comparison of desired PCB thickness vs. actual PCB thickness of the initial solution sets;
   (d) performing a crossover of the duplications of the initial solution sets of the stacked pattern design at random to form an offspring stacked solution by merging the duplications of the initial solution sets of the stacked pattern design at a randomly selected crossover point according to layers of the duplications of the initial solution sets of the stacked pattern design;
   (e) executing mutations at random by mutating or changing a layer of the offspring stacked solution for obtaining a result of a mutated stacked pattern;
   (f) performing an identification to check if a stacked pattern design solution generated by the duplication, crossover and mutation approaches a standard of demand according to desired PCB thickness, wherein the standard of demand is determined by the information data of the stacked pattern design input into the user interface;
   (g) repeating steps (c)-(f) until the stacked pattern design solution generated by the duplication, crossover and mutation reaches the standard of demand;
   whereby manual operation is replaced and time is saved;
   a storage unit connected to the processing unit wherein a plurality of current parameters of the PCB are stored in the storage unit; and
   an output unit connected to the processing unit wherein the stacked pattern design solution of the PCB generated by the duplication, crossover and mutation is displayed by the output unit.

2. The system of claim 1, wherein said input unit comprises a user interface which receives and displays the information data.

3. The system of claim 2, wherein said user interface comprises an automatic stack mode and an assigned stack mode.

4. The system of claim 1, wherein said information data of the stacked pattern design include type of PCB, type of top layer, PCB manufacturer, material of top layer, thickness of foil, numbers of signal layer, numbers of power layer, line-width, or total thickness of stacked pattern.

5. The system of claim 4, wherein said types of PCB comprise probe card, load board, or DUT board.

6. The system of claim 4, wherein said types of top layer comprise signal layer or ground layer.

7. The system of claim 4, wherein said materials of top layer comprise polypropylene (PP) or epoxy-glass composite (FR4).

8. The system of claim 1, wherein said processing unit which could load program to execute at least includes a processor and a memory.

9. The system of claim 1, wherein function of each layer of PCB could be determined by said processing unit depending on the information data.

10. The system of claim 1, wherein thickness of each layer of PCB could be determined by said processing unit depending on the information data.

11. A method for stacked pattern design of a printed circuit board (PCB), including steps of:
    (a) inputting information data of the stacked pattern design into a user interface;
    (b) generating initial solution sets of the stacked pattern design according to the information data;
    (c) generating duplications of the initial solutions sets of the stacked pattern design according to a fitness function of the initial solution sets, wherein said fitness function is calculated based on a formulated comparison of desired PCB thickness vs. actual PCB thickness of the initial solution sets;
    (d) performing a crossover of the duplications of the initial solution sets of the stacked pattern design at random to form an offspring stacked solution by merging the duplications of the initial solution sets of the stacked pattern design at a randomly selected crossover point according to layers of the duplications of the initial solution sets of the stacked pattern design;
    (e) executing mutations at random by mutating or changing a layer of the offspring stacked solution for obtaining a result of a mutated stacked pattern;
    (f) performing an identification to check if a stacked pattern design solution generated by the duplication, crossover and mutation approaches a standard of demand according to desired PCB thickness, wherein the standard of demand is determined by the information data of the stacked pattern design input into the user interface;
    (g) displaying the stacked pattern design solution generated by the duplication, crossover and mutation; and
    (h) repeating steps (c)-(f) until the stacked pattern design solution generated by the duplication, crossover and mutation reaches the standard of demand;
    whereby manual operation is replaced and time is saved.

12. The method of claim 11, wherein said method of stacked pattern design uses genetic algorithm to operate.

13. The method of claim 11, wherein said interface of input user software comprises an automatic stack mode or an assigned stack mode.

14. The method of claim 11, wherein said information data comprise type of PCB, type of top layer, PCB manufacturer, material of top layer, thickness of copper foil, numbers of signal layer, numbers of power layer, line-width, or total thickness of the stacked pattern design.

15. The method of claim 14, wherein said types of PCB comprise probe card, load board, or DUT board.

16. The method of claim 14, wherein said types of top layer comprise signal layer or ground layer.

17. The method of claim 14, wherein said materials of top layer comprise polypropylene (PP) or epoxy-glass composite (FR4).

18. The method of claim 11, wherein said initial solution sets of stacked pattern is generated by using current polypropylene (PP) layers and epoxy-glass composite (FR4) layers which are provided by PCB manufacturer and stored in database to construct.

19. The method of claim 11, wherein said fitness function expresses as $F(x)=1/[(\text{thickness of demand minus total thickness of stacked pattern})+1]$, and the total thickness of stacked pattern is calculated by summing all thickness of PP layers and thickness of FR4 layers, therefore, the highest value of the fitness function could be 1 as the thickness of demand equals to the thickness of stacked pattern.

20. The method of claim 11, wherein said standard of demand is that error of total thickness of the stacked pattern must be smaller than 5%.

21. A non-transitory computer-readable medium having computer-executable instructions for performing a method for stacked pattern design of a printed circuit board (PCB), wherein the method steps comprise:
 (a) inputting information data of the stacked pattern design into a user interface;
 (b) generating initial solution sets of the stacked pattern design according to the information data;
 (c) generating duplications of the initial solutions sets of the stacked pattern design according to a fitness function of the initial solution sets, wherein said fitness function is calculated based on a formulated comparison of desired PCB thickness vs. actual PCB thickness of the initial solution sets;
 (d) performing a crossover of the duplications of the initial solution sets of the stacked pattern design at random to form an offspring stacked solution by merging the duplications of the initial solution sets of the stacked pattern design at a randomly selected crossover point according to layers of the duplications of the initial solution sets of the stacked pattern design;
 (e) executing mutations at random by mutating or changing a layer of the offspring stacked solution for obtaining a result of a mutated stacked pattern;
 (f) performing an identification to check if a stacked pattern design solution generated by the duplication, crossover and mutation approaches a standard of demand according to desired PCB thickness, wherein the standard of demand is determined by the information data of the stacked pattern design input into the user interface;
 (g) displaying the stacked pattern design solution generated by the duplication, crossover and mutation; and
 (h) repeating steps (c)-(f) until the stacked pattern design solution generated by the duplication, crossover and mutation reaches the standard of demand;
 whereby manual operation is replaced and time is saved.

22. The computer-readable medium of claim 21, wherein said method of stacked pattern design uses genetic algorithm to operate.

23. The computer-readable medium of claim 21, wherein said user interface of input software comprises an automatic stack mode or an assigned stack mode.

24. The computer-readable medium of claim 21, wherein said information data comprise type of PCB, type of top layer, PCB manufacturer, material of top layer, thickness of copper foil, numbers of signal layer, numbers of power layer, linewidth, or total thickness of the stacked pattern design.

25. The computer-readable medium of claim 24, wherein said types of PCB comprise probe card, load board, or DUT board.

26. The computer-readable medium of claim 24, wherein said types of top layer comprise signal layer or ground layer.

27. The computer-readable medium of claim 24, wherein said materials of top layer comprise polypropylene (PP) or epoxy-glass composite (FR4).

28. The computer-readable medium of claim 21, wherein said initial solution sets of stacked pattern is generated by using current polypropylene (PP) layers which are stored in database to construct.

29. The computer-readable medium of claim 21, wherein said initial solution sets of stacked pattern is generated by using current epoxy-glass composite (FR4) layers which are stored in database to construct.

30. The computer-readable medium of claim 21, wherein said fitness function expresses as $F(x)=1/[(\text{thickness of demand minus total thickness of stacked pattern})+1]$, and the total thickness of the stacked pattern design is calculated by summing all thickness of PP layers and thickness of FR4 layers up, therefore, the highest value of the fitness function could be 1 as the thickness of demand equals to the thickness of the stacked pattern design.

31. The computer-readable medium of claim 21, wherein said standard of demand is that error of total thickness of the stacked pattern must be smaller than 5%.

* * * * *